United States Patent
Liu et al.

(10) Patent No.: US 10,602,644 B2
(45) Date of Patent: Mar. 24, 2020

(54) CHASSIS STRUCTURE

(71) Applicants: LITE-ON ELECTRONICS (GUANGZHOU) LIMITED, Guangzhou (CN); Lite-On Technology Corporation, Taipei (TW)

(72) Inventors: Yung-Lung Liu, Taipei (TW); Liang-Cheng Chiu, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 47 days.

(21) Appl. No.: 16/150,280

(22) Filed: Oct. 3, 2018

(65) Prior Publication Data
US 2019/0327866 A1 Oct. 24, 2019

(30) Foreign Application Priority Data
Apr. 24, 2018 (CN) .......................... 2018 1 0371336

(51) Int. Cl.
*H05K 9/00* (2006.01)
*G06F 1/18* (2006.01)
*H05K 7/14* (2006.01)

(52) U.S. Cl.
CPC .......... *H05K 9/0049* (2013.01); *G06F 1/181* (2013.01); *G06F 1/186* (2013.01); *H05K 7/1429* (2013.01)

(58) Field of Classification Search
CPC .... H05K 9/0049; H05K 7/1429; G06F 1/181; G06F 1/186
See application file for complete search history.

(56) References Cited

U.S. PATENT DOCUMENTS

| | | | | |
|---|---|---|---|---|
| 5,278,351 A | * | 1/1994 | Herrick | H05K 9/0049 174/372 |
| 2007/0139902 A1 | * | 6/2007 | Chen | G06F 1/184 361/796 |
| 2009/0147450 A1 | * | 6/2009 | Nara | G06F 1/181 361/679.01 |
| 2010/0264787 A1 | * | 10/2010 | Fan | G06F 1/184 312/223.2 |
| 2011/0094766 A1 | * | 4/2011 | Cheng | G06F 1/1633 174/50 |
| 2011/0221315 A1 | * | 9/2011 | Chen | G06F 1/182 312/223.2 |
| 2012/0327579 A1 | * | 12/2012 | Chen | G06F 1/184 361/679.6 |
| 2013/0044445 A1 | * | 2/2013 | Chiu | G06F 1/184 361/752 |
| 2013/0128540 A1 | * | 5/2013 | Kuo | H04N 5/64 362/97.1 |

(Continued)

*Primary Examiner* — Daniel P Wicklund
*Assistant Examiner* — Christopher L Augustin
(74) *Attorney, Agent, or Firm* — JCIPRNET

(57) ABSTRACT

A chassis structure including a box body is provided. The box body includes a main plate and a plurality of side plates. The main plate includes a hollow region and a bent component adjoining to the hollow region, wherein the bent component includes a folded edge connected to the hollow region. The side plates surround a periphery of the main plate and define an accommodating space. Therefore, manufacturing costs are saved, a manufacturing process is simplified, and smoothness and neatness in appearance are maintained.

17 Claims, 8 Drawing Sheets

(56) References Cited

U.S. PATENT DOCUMENTS

| | | | |
|---|---|---|---|
| 2014/0028164 A1* | 1/2014 | Chen | G06F 1/181 312/223.2 |
| 2014/0168868 A1* | 6/2014 | Hsiao | G06F 1/181 361/679.01 |
| 2017/0172019 A1* | 6/2017 | Kurz | H05K 7/2039 |
| 2018/0232015 A1* | 8/2018 | Chiu | G06F 1/181 |

* cited by examiner

CHASSIS STRUCTURE

CROSS-REFERENCE TO RELATED APPLICATION

This application claims the priority benefit of China application serial no. 201810371336.7, filed on Apr. 24, 2018. The entirety of the above-mentioned patent application is hereby incorporated by reference herein and made a part of this specification.

BACKGROUND

Technical Field

The disclosure relates to a chassis structure, and particularly relates to a chassis structure having a bent component.

Description of Related Art

As technology advances, personal computers have been widely applied in work and life. Common personal computers currently include desktop computers and notebook computers.

In terms of desktop computers, a host chassis may be disassembled into a box body and a cover plate. Generally, the box body is formed by stacking two metal components, i.e., a first metal component and a second metal component. In a conventional manufacturing process, the first metal component is bent to form a main plate and two side plates (e.g., an upper side plate and a lower side plate) of the box body. At the same time, a second main plate is stamped and bent to form a mounting bracket disposed inside the main plate and two other opposite side plates (e.g., a front side plate and a rear side plate). The mounting bracket usually includes a fixture structure for securing a motherboard, a power screw lock, a hard drive rack, etc. The front side plate and the rear side plate include through holes for exposing the motherboard or expansion cards, or slots for mounting a hard drive or an optical disk drive. Afterwards, the two metal components are combined (i.e., stacking the main plate and the mounting bracket and arranging each of the side plates to its relative position), the side plates are connected by means such as welding or riveting to form the box body, and the cover plate is covered to complete the host chassis. In the foregoing design, it is necessary to manufacture the box body in a two-stage procedure, which not only produces much waste material but also takes more labor and time.

Besides, a dedicated rack is usually used to support the main plate and to fix the main plate onto the host chassis. However, fixing the main plate by the dedicated rack not only increases manufacturing costs but also complicates assembly processes. Another approach is to fix the main plate on the lower cover of the chassis by means of screwing, riveting, or other methods that involve penetrating through the main plate. However, in such kind of approach, after the assembly is completed, a stud mark would be left on the lower cover of the chassis. As a result, the host chassis is not smooth and neat in appearance.

SUMMARY

The disclosure provides a chassis structure that not only saves manufacturing costs and simplifies a manufacturing process but also maintains smoothness and neatness in appearance.

The chassis structure of this disclosure includes a box body. The box body includes a main plate and a plurality of side plates. The main plate includes a hollow region and a bent component adjoining to the hollow region, wherein the bent component includes a folded edge connected to the hollow region. The plurality of side plates surround a periphery of the main plate and define an accommodating space.

In an embodiment of the disclosure, the chassis structure further includes a cover, and the cover is assembled to an outer surface of the main plate and covers the hollow region of the main plate.

In an embodiment of the disclosure, the main plate further includes an inner surface opposite to the outer surface, and the bent component is disposed on the inner surface.

In an embodiment of the disclosure, the main plate and the plurality of side plates are an integral structure.

In an embodiment of the disclosure, the hollow region and the bent component of the main plate correspond to each other in shape.

In an embodiment of the disclosure, the bent component further includes a bonding portion bonded to an inner surface of the main plate.

In an embodiment of the disclosure, the bent component further includes a cradle connected to the bonding portion.

In an embodiment of the disclosure, the cradle and the inner surface of the main plate are spatially separated from each other.

In an embodiment of the disclosure, the bonding portion is connected to two adjacent sides of the cradle.

In an embodiment of the disclosure, the bonding portion includes two sub-bonding portions, and the two sub-bonding portions are disposed on two opposite sides of the cradle.

In an embodiment of the disclosure, the bent component further includes a bump, and at least a portion of the bump is disposed on the cradle.

In an embodiment of the disclosure, the bump is connected to the bonding portion.

In an embodiment of the disclosure, the bump of the bent component has an assembling hole.

In an embodiment of the disclosure, the bent component includes a first sub-bent component and a second sub-bent component connected to the first sub-bent component, the first sub-bent component includes a first folded edge connected to the hollow region, and the second sub-bent component includes a second folded edge connected to the first sub-bent component.

In an embodiment of the disclosure, the first sub-bent component and the second sub-bent component of the main plate are an integral structure.

In an embodiment of the disclosure, the first sub-bent component includes a bent body, and the bent body has an opening.

In an embodiment of the disclosure, the second sub-bent component includes an overlapping portion, and the overlapping portion overlaps with the bent body of the first sub-bent component.

In an embodiment of the disclosure, the overlapping portion of the second sub-bent component is connected to the second folded edge of the second sub-bent component.

In an embodiment of the disclosure, the overlapping portion of the second sub-bent component is located between an inner surface of the main plate and the bent body of the first sub-bent component.

In an embodiment of the disclosure, the bent body of the first sub-bent component is located between an inner surface of the main plate and the overlapping portion of the second sub-bent component.

Based on the foregoing, the chassis structure of this disclosure includes a main plate. The main plate and the bent component are integrally formed, and the bent component and the bump disposed thereon are also integrally formed. The assembling hole is disposed on the bump for mounting the main plate. Through such design of the main plate, the electronic component may be directly disposed in the chassis structure without the need to add an additional dedicated rack for fastening the electronic component onto the chassis as in the existing design. There is also no need to provide a riveting hole or other exposed structures on the outer surface of the main plate for fastening the electronic component, thereby maintaining smoothness and neatness of the outer surface of the main plate. In addition, the box body of the chassis structure in this disclosure provides a complete side plate, and it is not necessary to stack the metal components to form the box body and then to form a complete chassis as in the existing design, so the manufacturing costs are thereby saved.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
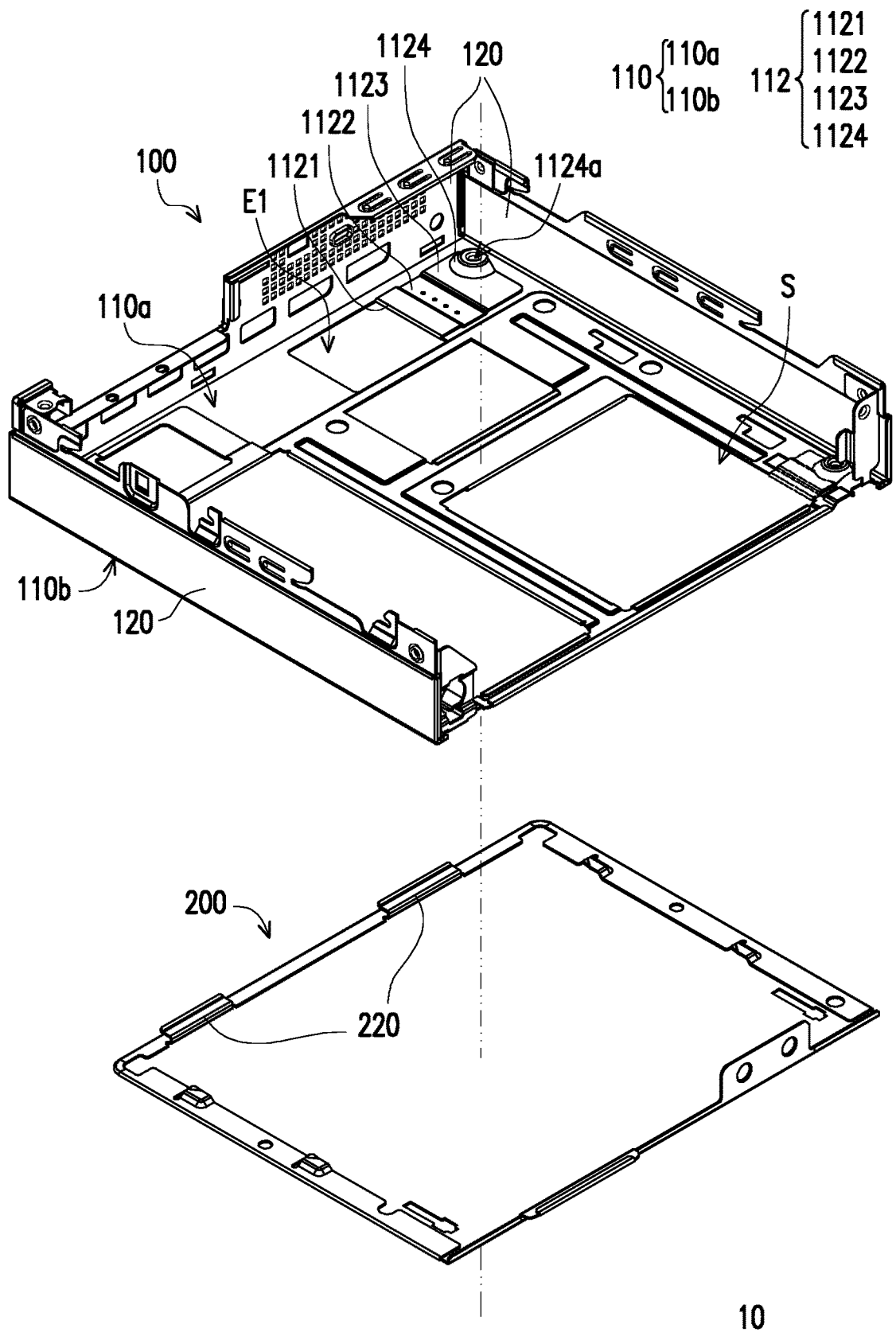
FIG. 1 is an exploded perspective view of a chassis structure according to an embodiment of the disclosure.

FIG. 1 is an exploded perspective view of a chassis structure according to an embodiment of the disclosure. With reference to FIG. 1, in the present embodiment, a chassis structure 10 includes a box body 100. The box body 100 includes a main plate 110 and a plurality of side plates 120. The side plates 120 surround a periphery of the main plate 110 and define an accommodating space S. The main plate 110 includes a hollow region E1 and a bent component 112 adjoining to the hollow region E1. The bent component 112 includes a folded edge 1121 connected to the hollow region E1. It should be understood that a plurality of bent components may be provided on the main plate according to actual design requirements. The disclosure does not impose limitations on the number of the bent component. Accordingly, in the chassis structure 10 as shown in FIG. 1, the rest of the bent components are indicated by dotted lines.

For example, the box body 100 is formed of one single metal component so that the box body 100 is provided in an integral manner (i.e., the main plate 110 and the side plates 120 are an integral structure). Different from the existing design where two metal components are stacked to form the box body, the box body 100 as an integral structure in this disclosure saves manufacturing costs while simplifying the manufacturing process. In the present embodiment, the main plate 110 is, for example, a rectangular main plate and includes an outer surface 110a and an inner surface 110b opposite to the outer surface 110a. The side plates 120 are respectively connected to the edges of the rectangular main plate. Furthermore, the main plate 110 and the side plates 120 are, for example, integrally formed. Each of the side plates 120 may be formed on the periphery of the main plate 110 and be bent during a stamping process. In some embodiments, the side plates 120 may be combined with each other by means of riveting. In other embodiments, the side plates 120 may be securely bonded to each other by wedging or by other suitable bonding methods.

In the present embodiment, the bent component 112 may be disposed on the inner surface 110b of the main plate 110. The hollow region area E1 and the bent component 112 of the main plate 110 may correspond to each other in shape.

Specifically, in the present embodiment, the bent component 112 of the main plate 110 is formed by bending a part of the main plate 110. That is, the main plate 110 and the bent component 112 are an integral structure so as to further save material costs. For example, stamping and cutting may be performed on the main plate 110 to form the required shape of the bent component 112. Next, the bent component 112 is bent towards the inside of the accommodating space S. Then, the bent component 112 is bent toward the inner surface 110b of the main plate 110 in the direction of the side plate 120 so as to be bonded to the expected configuration position of the inner surface 110b of the main plate 110, thereby completing the configuration of the bent component 112. Since a formation material of the bent component 112 is entirely formed by stamping the main plate 110, after the bent component 112 is stamped and bent, the hollow region E1 is left at the corresponding position at the main plate 110. The shape of the hollow region E1 approximately corresponds to the shape of the bent component 112, and the folded edge 1121 of the bent component 112 connects to one side of the hollow region E1.

In this disclosure, the bent component further includes components such as a bonding portion, a cradle, and a bump. In the present embodiment, the bent component 112 further includes a bonding portion 1122, a cradle 1123 connected to the bonding portion 1122, and a bump 1124 disposed on the cradle 1123. The bonding portion 1122 may be bonded to the inner surface 110b of the main plate 110. The cradle 1123 and the inner surface 110b of the main plate 110 may be spatially separated from each other. The bump 1124 may be optionally provided with an assembling hole 1124a. The assembling hole 1124a may be disposed correspondingly to a corner of the main plate 110 as required. In other embodiments, the assembling hole 1124a may also be disposed correspondingly to the center or the periphery of the main plate 110. The disclosure does not impose limitations on the configuration position of the assembling hole 1124a.

For example, the bent component 112 may be pressed by means of stamping to form a plurality of portions of the bent component 112 (e.g., the bonding portion 1122, the cradle 1123, and the bump 1124). The bonding portion 1122 may be bonded onto the inner surface 110b of the main plate 110 by means of spot welding or by another suitable welding method depending on different workpieces, thereby fixing the bent component 112. In other embodiments, an additional bonding material (e.g., solder) may also be used to perform bonding. Alternatively, the bent component 112 may also be fixed on the main plate 110 by means of a snap-fit mechanism, but the disclosure is not limited thereto. In addition, the cradle 1123 of the bent component 112, for example, extends from the bonding portion 1122 in a direction away from the inner surface 110b of the main plate 110 to lift a portion of the bent component 112 away from the main plate 110, so that the cradle 1123 and the inner surface 110b of the main plate 110 are separated from each other.

The bump 1124 may be partially or completely disposed on the cradle 1123 and protrude from the surface of the cradle 1123. The bump 1124 may be circular in shape or may have other protruding shapes according to design requirements. The bump 1124 may be provided with an assembling hole 1124a thereon for fixing an electronic component (not shown). For example, the bump 1124 may be disposed correspondingly to a locking position (e.g., a corner, an edge or other suitable positions at the main plate 110) of the electronic component (e.g., a circuit board) so that it may be used for fixing the electronic component on the chassis structure 10. Since the bonding portion 1122 of the bent component 112 is fixed on the main plate 110, when locking the electronic component, the bump 1124 does not shift and deform laterally due to an external force, and so does not result in position deviation of the electronic component in the chassis structure 10. In addition, since the cradle 1123 of the bent component 112 is spatially separated from the inner surface 110b of the main plate 110, and since the bump 1124 disposed on the cradle 1123 is even further away from the inner surface 110b of the main plate 110, the main plate 110 is not damaged during the locking of the electronic component, and the complete appearance of the box body 100 is maintained accordingly.

Figure 2A:
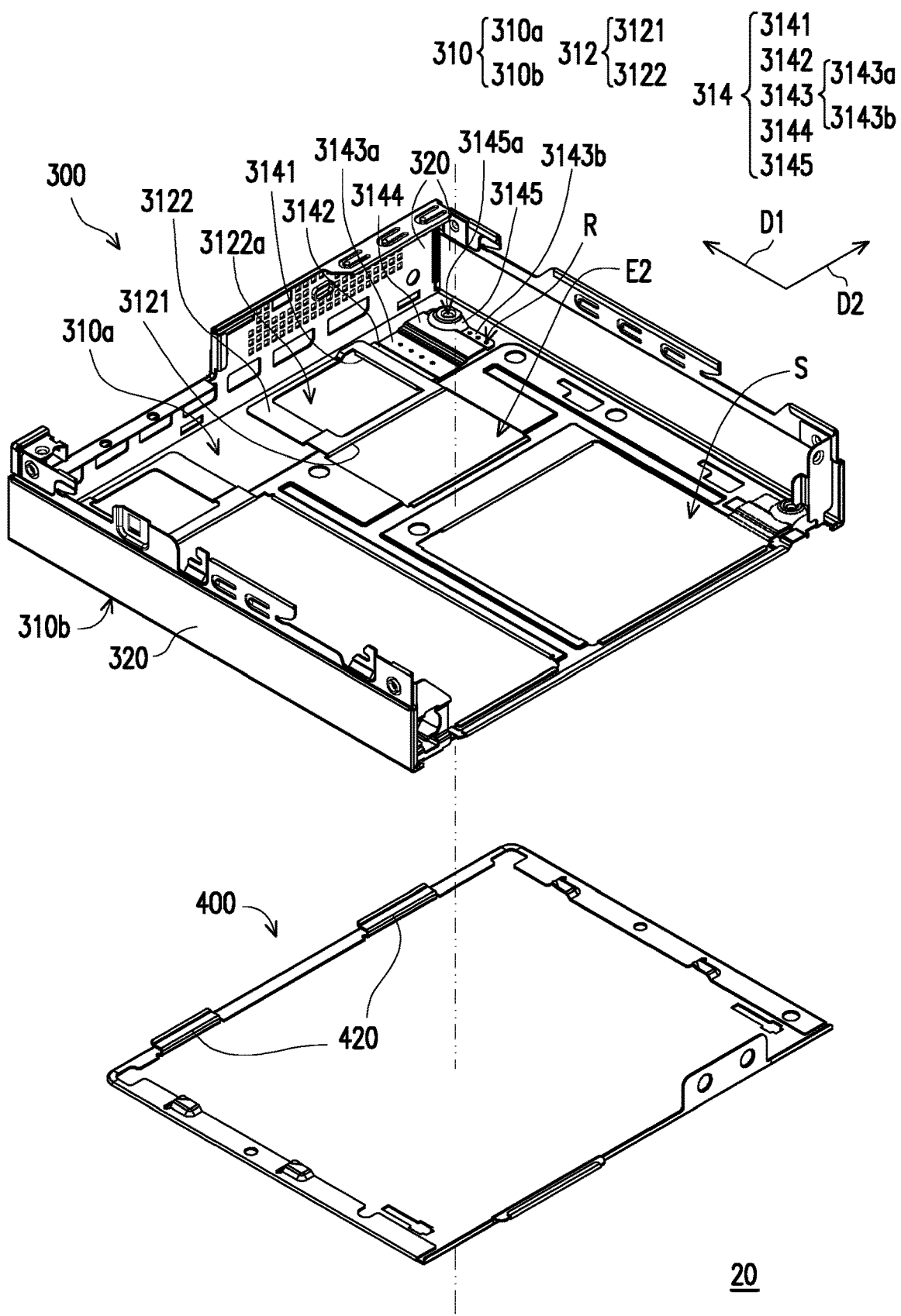
FIG. 2A is an exploded perspective view of a chassis structure according to another embodiment of the disclosure.
Figure 5:
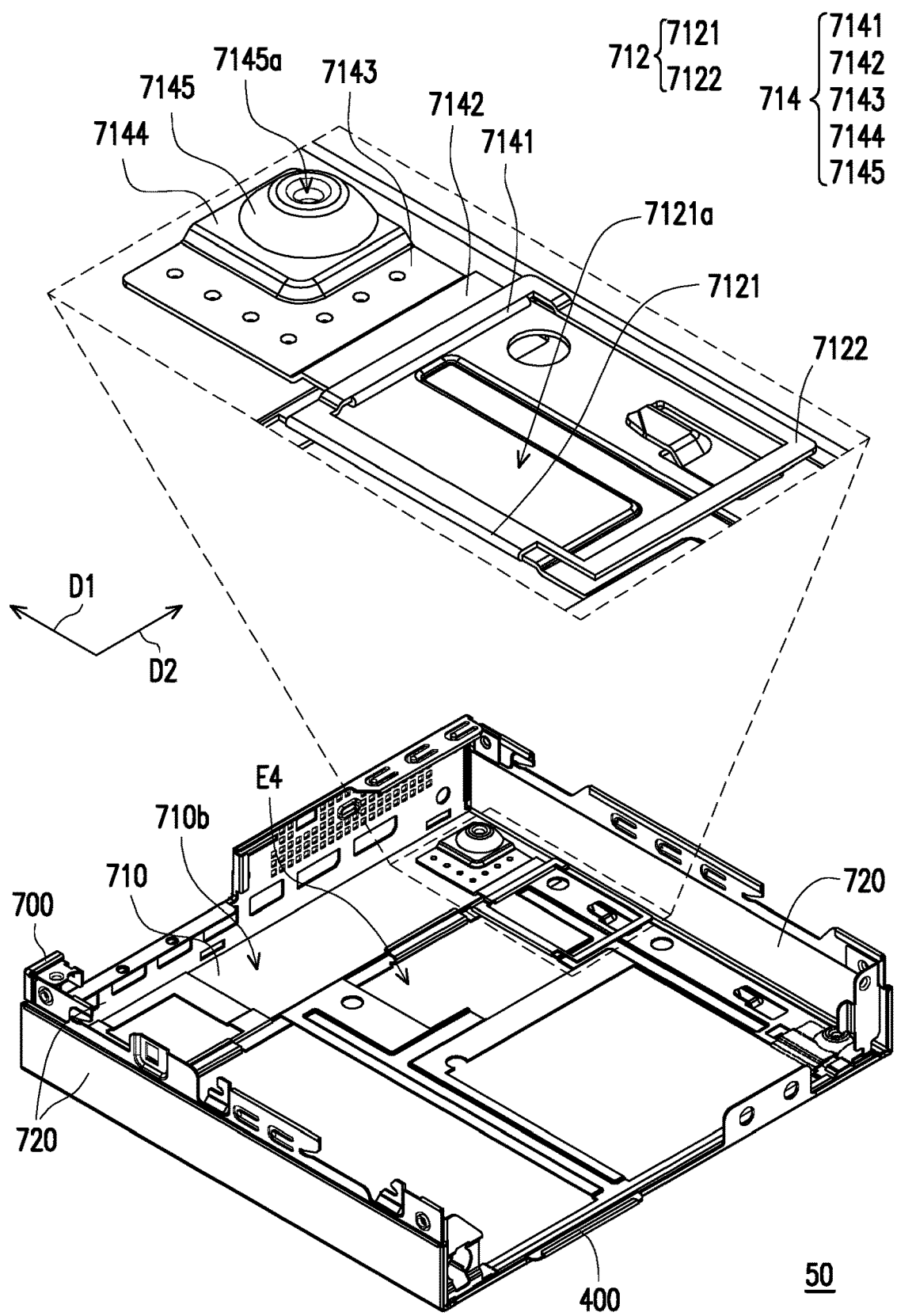
FIG. 5 is a schematic perspective view of a chassis structure according to another embodiment of the disclosure.
Figure 6:
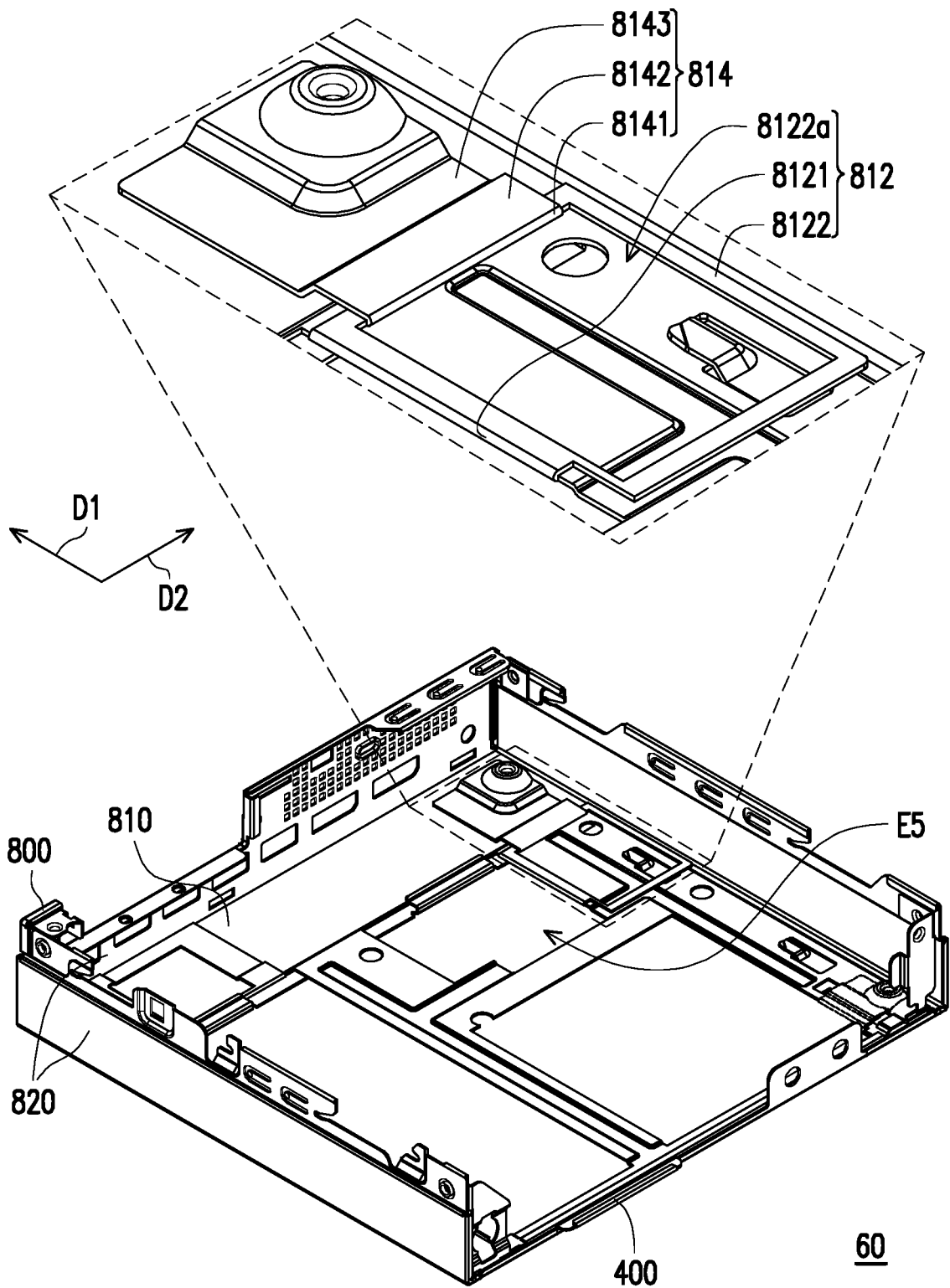
FIG. 6 is a schematic perspective view of a chassis structure according to another embodiment of the disclosure.

In other embodiments, the bump of the bent component may be connected to the bonding portion, or the bonding portion may include two sub-bonding portions disposed on two opposite sides of the cradle (similar to the configuration of the sub-bonding portions, the cradle and the bump as shown in FIG. 2A). The bonding portion may be connected to two adjacent sides of the cradle (similar to the configuration of the bonding portion and the cradle as shown in FIG. 5 or FIG. 6). However, the configuration of the bent component in this disclosure is not limited thereto.

In the present embodiment, the chassis structure 10 further includes a cover 200. The cover 200 may be assembled to the outer surface 110a of the main plate 110 to cover the hollow region E1 of the main plate 110. For example, the cover 200 includes buckling slots 220, through which the cover 200 is fixed on the main plate 110. It should be understood that although two buckling slots 220 are shown in FIG. 1, the number of the buckling slot 220 may be increased or decreased and the configuration position thereof may be adjusted according to actual design requirements. The disclosure does not impose limitations on the number and the type of the buckling slot 220. The cover 200 may be smaller than the main plate 110 in size so as to partially cover the outer surface 110a of the main plate 110, and the size of the cover 200 may correspond to that of the main plate 110 to completely cover the outer surface 110a of the main plate 110. By the configuration of the cover 200, smoothness and neatness of the outer surface 110a of the main plate 110 may be maintained, and the electronic component in the chassis structure 10 may also be protected.

Figure 2B:
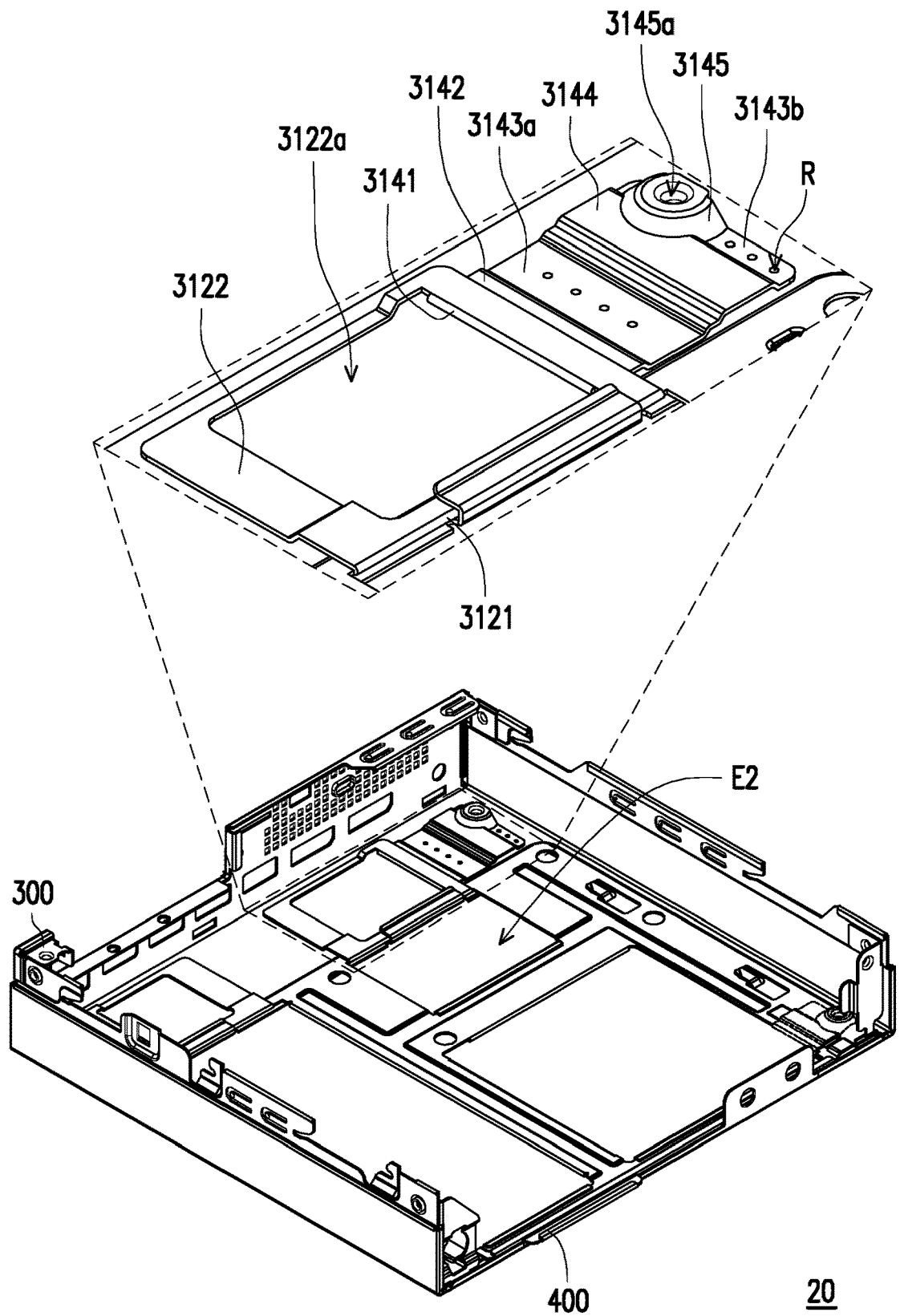
FIG. 2B is a schematic perspective view of the box body and the cover of FIG. 2A after assembly.
Figure 2C:
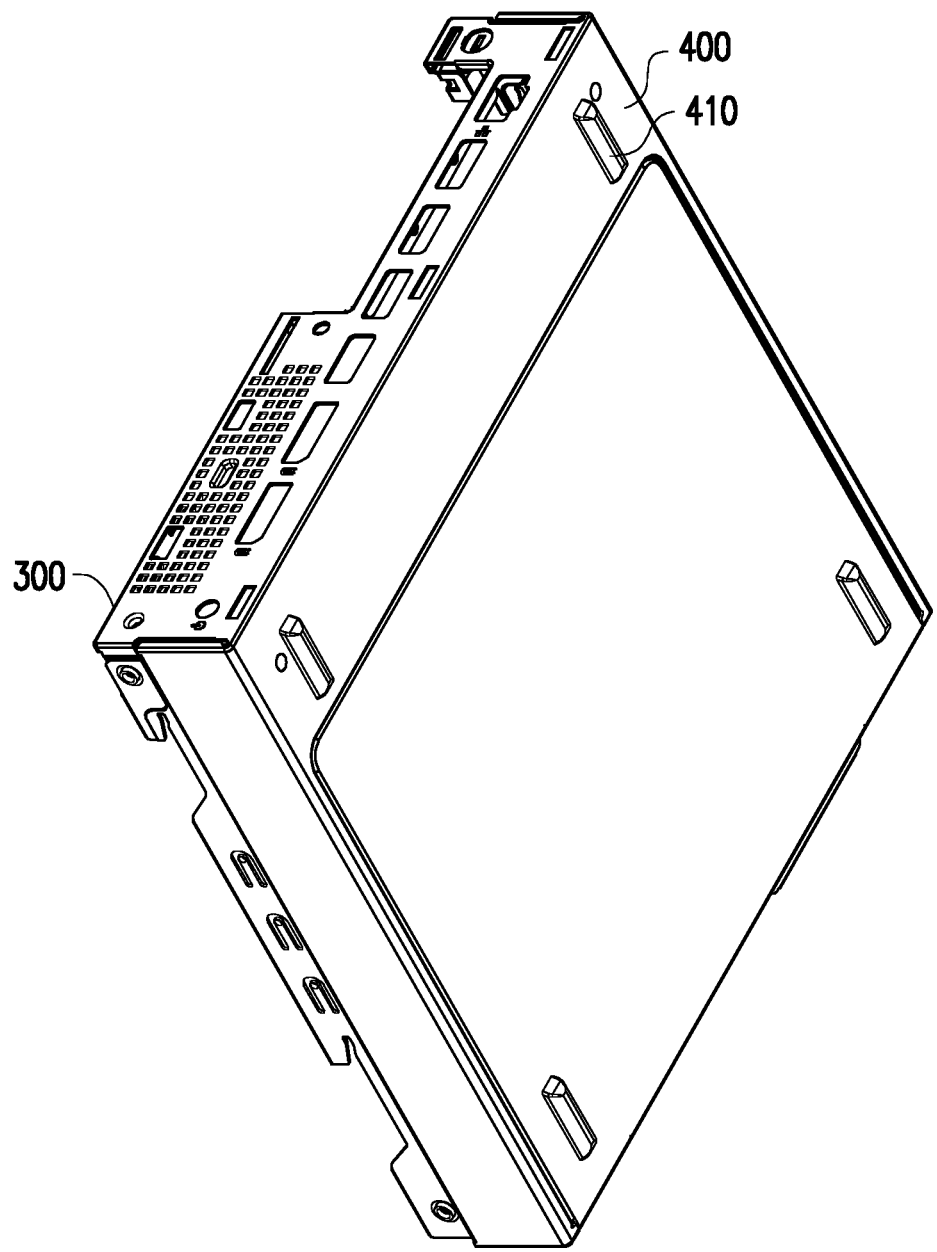
FIG. 2C is a schematic perspective view of the box body and the cover after assembly from another angle.

FIG. 2A is an exploded perspective view of a chassis structure according to another embodiment of the disclosure. FIG. 2B is a schematic perspective view of the box body and the cover of FIG. 2A after assembly. FIG. 2C is a schematic perspective view of the box body and the cover after assembly from another angle. With reference to FIG. 2A to FIG. 2C, in the present embodiment, a chassis structure 20 includes a box body 300. The box body 300 includes a main plate 310 and a plurality of side plates 320. The side plates 320 surround a periphery of the main plate 310 and define an accommodating space S. The main plate 310 includes a hollow region E2 and a bent component adjoining to the hollow region E2, and the bent component includes a first sub-bent component 312 and a second sub-bent component 314. The first sub-bent component 312 includes a first folded edge 3121 adjoining to the hollow region E2. The second sub-bent component 314 includes a second folded edge 3141 adjoining to the first sub-bent component 312.

It should be understood that the main plate of the disclosure may be provided with one sub-bent component, a pair of sub-bent components or more than two sub-bent components. The disclosure does not impose limitations on the number of the sub-bent component. Besides, the bent component as described in the foregoing embodiment may also be provided as required. In this disclosure, the first sub-bent component and the second sub-bent component in each pair may be disposed on the inner surface of the main plate by the same configuration, or may be separately disposed on the inner surface of the main plate by different configurations. The disclosure does not impose limitations on the numbers of the first sub-bent component and the second sub-bent component and the configuration method of each pair of the first sub-bent component and the second sub-bent component. Accordingly, in FIG. 2A and FIG. 2B, the rest of the first sub-bent components and the second sub-bent components are indicated by dotted lines. Alternative configurations of the first sub-bent component and the second sub-bent component will be described in detail in the following embodiments with reference to the accompanying drawings.

In the present embodiment, similar to the box body 100, the box body 300 is formed of one single metal component so that the box body 300 is provided as an integral structure. Also similar to the main plate 110, the main plate 310 includes an outer surface 310a and an inner surface 310b opposite to the outer surface 310a. The side plates 320 are similar to the side plates 120. Accordingly, details thereof are omitted hereinafter.

In the present embodiment, the first sub-bent component 312 and the second sub-bent component 314 may be disposed on the inner surface 310b of the main plate 310. The hollow region area E2 of the main plate 310 and the first sub-bent component 312 may correspond to each other in shape. The first sub-bent component 312 and the second sub-bent component 314 are an integral structure. For example, the first sub-bent component 312 includes a bent body 3122 having an opening 3122a. The opening 3122a of the bent body 3122 and the second sub-bent component 314 may correspond to each other in shape. A side of the bent body 3122 is the first folded edge 3121, and the bent body 3122 is configured to be bent towards a first direction D1 from the first folded edge 3121 adjoining to the hollow region E2. The length direction of the bent body 3122 may be perpendicular to the first direction D1. One end of the opening 3122a of the bent body 3122 adjoins to the second folded edge 3141, and the second sub-bent component 314 may be configured to be bent in a second direction D2 from the second folded edge 3141 adjoining to the opening 3122a. The second direction D2 is, for example, perpendicular to the length direction of the second folded edge 3141.

In the present embodiment, the second sub-bent component 314 includes an overlapping portion 3142, and the overlapping portion 3142 overlaps with the bent body 3122 of the first sub-bent component 312. The overlapping portion 3142 of the second sub-bent component 314 is connected to the second folded edge 3141. For example, the overlapping portion 3142 of the second sub-bent component 314 is located between the inner surface 310b of the main plate 310 and the bent body 3122 of the first sub-bent component 312.

In detail, the first sub-bent component 312 and the second sub-bent component 314 of the main plate 310 may be respectively formed by bending a part of the main plate 310. That is, the main plate 310 and the first sub-bent component 312 and the second sub-bent component 314 are an integral structure, thereby further saving material costs. Specifically, the first sub-bent component 312 may be cut out from a predetermined position at the main plate 310, and the first sub-bent component 312 is connected to the main plate 310 by the first folded edge 3121. The second sub-bent component 314 may be cut out from a predetermined position of the first sub-bent component 312, and the second sub-bent component 314 is connected to the bent body 3122 of the first sub-bent component 312 by the second folded edge 3141.

For example, after the stamping process is performed on the main plate 310, the first sub-bent component 312 and the second sub-bent component 314 are formed. In the present embodiment, the second sub-bent component 314 may first be bent out from a predetermined position of the first sub-bent component 312 of the main plate 310 through the second folded edge 3141 toward the direction of the accommodating space S. Then, the second sub-bent component 314 may be further bent toward the second direction D2 (such as perpendicular to the length direction of the second folded edge 3141). For example, the second sub-bent component 314 may be bent to be substantially parallel to the inner surface 310b of the main plate 310, so that a portion of the second sub-bent component 314 overlaps with the first sub-bent component 312, and this portion may be referred to as the overlapping portion 3142 of the second sub-bent component 314. At this time, the overlapping portion 3142 of the second sub-bent component 314 is located above the first sub-bent component 312. The opening 3122a is formed in the region where the second sub-bent component 314 is bent out from the first sub-bent component 312, and the bent body 3122 of the first sub-bent component 312 is left on the main plate 310. However, the disclosure does not impose limitations on the angle between the second folded edge 3141 of the second sub-bent component 314 and the overlapping portion 3142 or between the second folded edge 3141 of the second sub-bent component 314 and the bent body 3122 of the first sub-bent component 312. This angle may be adjusted according to the user's requirements.

Subsequently, the bent body 3122 of the first sub-bent component 312 may be bent out from a predetermined position of the main plate 310 through the first folded edge 3121 toward the direction of the accommodating space S, and the hollow region E2 is then formed in the region where the first sub-bent component 312 is bent out from the main plate 310. Then, the bent body 3122 may be further folded toward the inner surface 310b of the main plate 310 in the first direction D1 perpendicular to the length direction of the first folded edge 3121. The first direction D1 and the second direction D2 are, for example, perpendicular to each other on the plane where the inner surface 310b is located. However, the disclosure does not impose limitations on the angle between the first folded edge 3121 of the first sub-bent component 312 and the bent body 3122 or between the first folded edge 3121 of the first sub-bent component 312 and the inner surface 310b of the main plate 310. This angle may be adjusted according to the user's requirements.

Since the second sub-bent component 314 is connected to the bent body 3122 of the first sub-bent component 312 via the second folded edge 3141, when a bending process is performed on the first sub-bent component 312, the second sub-bent component 314 also moves along with the first sub-bent component 312. As a result, when the bent body 3122 of the first sub-bent component 312 is bent in the first direction D1 and comes close to the inner surface 310b of the main plate 310, the second sub-bent component 314 also comes close to the inner surface 310b of the main plate 310, so that the overlapping portion 3142 of the second sub-bent component 314 is located between the bent body 3122 of the first sub-bent component 312 and the inner surface 310b of the main plate 310. The bonding operation may be performed after the second sub-bent component 314 is closely attached to the expected configuration position, so that the second sub-bent component 314 is disposed on the inner surface 310b of the main plate 310.

In the present embodiment, the second sub-bent component 314 further includes a bonding portion 3143, a cradle 3144 connected to the bonding portion 3143, and a bump 3145 partially or completely disposed on the cradle 3144. For example, the bonding portion 3143 is connected to the overlapping portion 3142 and is bonded onto the inner surface 310b of the main plate 310. The cradle 3144 and the inner surface 310b of the main plate 310 are spatially separated from each other. In the present embodiment, the bonding portion 3143 includes a sub-bonding portion 3143a and a sub-bonding portion 3143b that may be connected to two opposite sides of the cradle 3144 respectively. The bump 3145 has an assembling hole 3145a and is connected to the sub-bonding portion 3143b. The assembling hole 3145a of the bump 3145 may correspond to a corner of the main plate 310.

For example, the second sub-bent component 314 is similar to the bent component 112 and a plurality of portions of the second sub-bent component 314 (e.g., the bonding portion 3143, the cradle 3144, and the bump 3145) may be formed by means of stamping. The sub-bonding portions 3143a and 3143b may be bonded onto the inner surface 310b of the main plate 310 by means of spot welding or by another suitable welding method, thereby fixing the second sub-bent component 314. For example, the sub-bonding portions 3143a and 3143b may have one or more recesses R, respectively. When the sub-bonding portions 3143a and 3143b are bonded to the main plate 310 by means of welding, a peripheral material of the recess R is melted by a high temperature and is bonded on the main plate 310. By gathering the melted portion in the recess R, irregular melting is prevented from occurring in other regions of the sub-bonding portions 3143a and 3143b. In other embodiments, the second sub-bent component 314 may also be fixed on the main plate 310 using an additional bonding material or by means of snap-fit mechanism, but the disclosure is not limited thereto.

In addition, the sub-bonding portion 3143a may be connected between the overlapping portion 3142 and the cradle 3144, and the sub-bonding portion 3143*b* may be disposed at another side of the cradle 3144 closer to the side plates 320. The cradle 3144, for example, extends from the sub-bonding portions 3143*a* and 3143*b* in a direction away from the inner surface 310*b* of the main plate 310 to lift a portion of the second sub-bent component 314 away from the main plate 310, so that the cradle 3144 and the inner surface 310*b* of the main plate 310 are separated from each other. In addition, the cradle 3144 and the sub-bonding portion 3143*b* connected to the cradle 3144 may be stamped to form a bump 3145 that protrudes from the surface of the cradle 3144 and the sub-bonding portion 3143*b*. In other words, a portion of the bump 3145 may be disposed on the cradle 3144, and another portion thereof may be connected to the sub-bonding portion 3143*b*.

Since the bump 3145 is formed by stamping the cradle 3144, after the second sub-bent component 314 is fixed to the main plate 310 via the bonding portion 3143, the distance between the bump 3145 and the inner surface 310*b* of the main plate 310 may be greater than the distance between the cradle 3144 and the inner surface 310*b* of the main plate 310. The assembling hole 3145*a* may be optionally provided on the bump 3145. By disposing the bump 3145 on the inner surface 310*b* of the main plate 310 and by disposing the assembling hole 3145*a* correspondingly to the predetermined locking position of the electronic component, the electronic component is fixed in the chassis structure 20. Since one end of the bump 3145 is connected to the sub-bonding portion 3143*b* and since the sub-bonding portion 3143*b* is fixed on the inner surface 310*b* of the main plate 310, when the electronic component is locked through the assembling hole 3145*a* of the bump 3145, the bump 3145 does not shift laterally or dislocated due to an external force, thereby ensuring that the electronic component is fixed at a predetermined position in the accommodating space S of the chassis structure 20.

In the present embodiment, the chassis structure 20 further includes a cover 400. The cover 400 may be assembled to the outer surface 310*a* of the main plate 310 through a buckling slot 420, and the cover 400 may cover the hollow region E2 of the main plate 310. Similar to the cover 200, the cover 400 of the present embodiment may partially or completely cover the outer surface 310*a* of the main plate 310 to maintain smoothness and neatness of the outer surface 310*a* of the main plate 310 and also to protect the electronic component in the chassis structure 20. In addition, a plurality of cushions 410 may be disposed on the cover 400. For example, after the cover 400 is assembled to the main plate 310, the position of the cushion 410 may correspond to the position of the cradle 3144.

Figure 3:
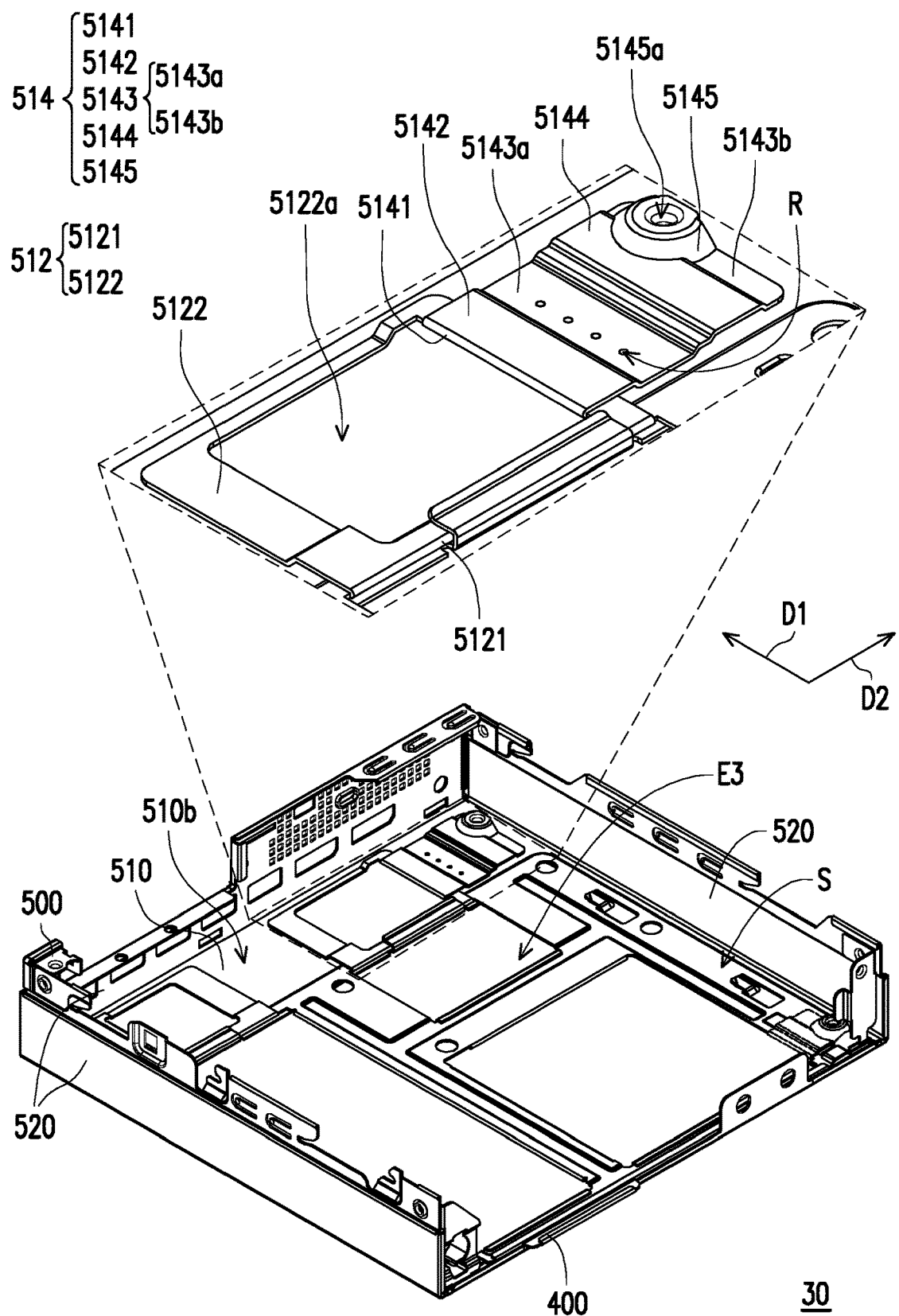
FIG. 3 is a schematic perspective view of a chassis structure according to another embodiment of the disclosure.

FIG. 3 is a schematic perspective view of a chassis structure according to another embodiment of the disclosure. Referring to FIG. 3, FIG. 3 shows a chassis structure 30 after the assembly of a box body 500 and a cover 400, where a main plate 510 and side plates 520 of the box body 500 and the cover 400 have similar configurations and functions as the chassis structure 20 shown in FIG. 2B. Accordingly, details thereof are omitted hereinafter. A difference between the chassis structure 30 of the present embodiment and the chassis structure 20 in FIG. 2B lies in that a bent body 5122 of a first sub-bent component 512 of the main plate 510 is located between an inner surface 510*b* of the main plate 510 and an overlapping portion 5142 of a second sub-bent component 514.

For example, after the stamping process is performed on the main plate 510, the first sub-bent component 512 and the second sub-bent component 514 are formed. In the present embodiment, the first sub-bent component 512 may be bent out from a predetermined position of the main plate 510 through a first folded edge 5121 toward the direction of an accommodating space S, and a hollow region E3 is then formed in the region where the first sub-bent component 512 is bent out from the main plate 510. Then, the first sub-bent component 512 may be further folded toward the inner surface 510*b* of the main plate 510 in the first direction D1. Subsequently, the second sub-bent component 514 may be bent out from a predetermined position of the first sub-bent component 512 through a second folded edge 5141 toward the direction of the accommodating space S. An opening 5122*a* is then formed in the region where the second sub-bent component 514 is bent out from the first sub-bent component 512, and the bent body 5122 of the first sub-bent component 512 is left on the main plate 510. The second sub-bent component 514 may be further bent in the second direction D2 perpendicular to the length direction of the second folded edge 5141 and come close to the inner surface 510*b* of the main plate 510, so that the second sub-bent component 514 is disposed on a predetermined position at the main plate 510. Consequently, the overlapping portion 5142 of the second sub-bent component 514 is located above the bent body 5122 of the first sub-bent component 512, so that the bent body 5122 is located between the overlapping portion 5142 of the second sub-bent component 514 and the inner surface 510*b* of the main plate 510.

In other words, in the embodiment shown in FIG. 2B, the second bent component 314 is first bent out from the first sub-bent component 312 through the second folded edge 3141 to form the opening 3122*a* in the first sub-bent component 312, and then the first sub-bent component 312 is bent out from the main plate 310 via the first folded edge 3121 to form the hollow region E2 of the main plate 310. As a result, the overlapping portion 3142 of the second sub-bent component 314 is located between the bent body 3122 of the first sub-bent component 312 and the inner surface 310*b* of the main plate 310. On the other hand, in the present embodiment, the first sub-bent component 512 is first bent out from the main plate 510 via the first folded edge 5121 to form the hollow region E3 of the main plate 510. After that, the second sub-bent component 514 is then bent out from the first sub-bent component 512 via the second folded edge 5141, so that the opening 5122*a* is formed in the first sub-bent component 512. As a result, the overlapping portion 5142 of the second sub-bent component 514 is located above the bent body 5122 of the first sub-bent component 512.

In addition, in the present embodiment, the sub-bonding portion 5143*a* may include a recess R, and the sub-bonding portion 5143*b* connected to the bump 5145 is not provided with the recess R. For example, the sub-bonding portion 5143*b* may be attached to the inner surface 510*b* of the main plate 510 by a bonding material. In other embodiments, none of the two sub-bonding portions is provided with a recess.

Figure 4:
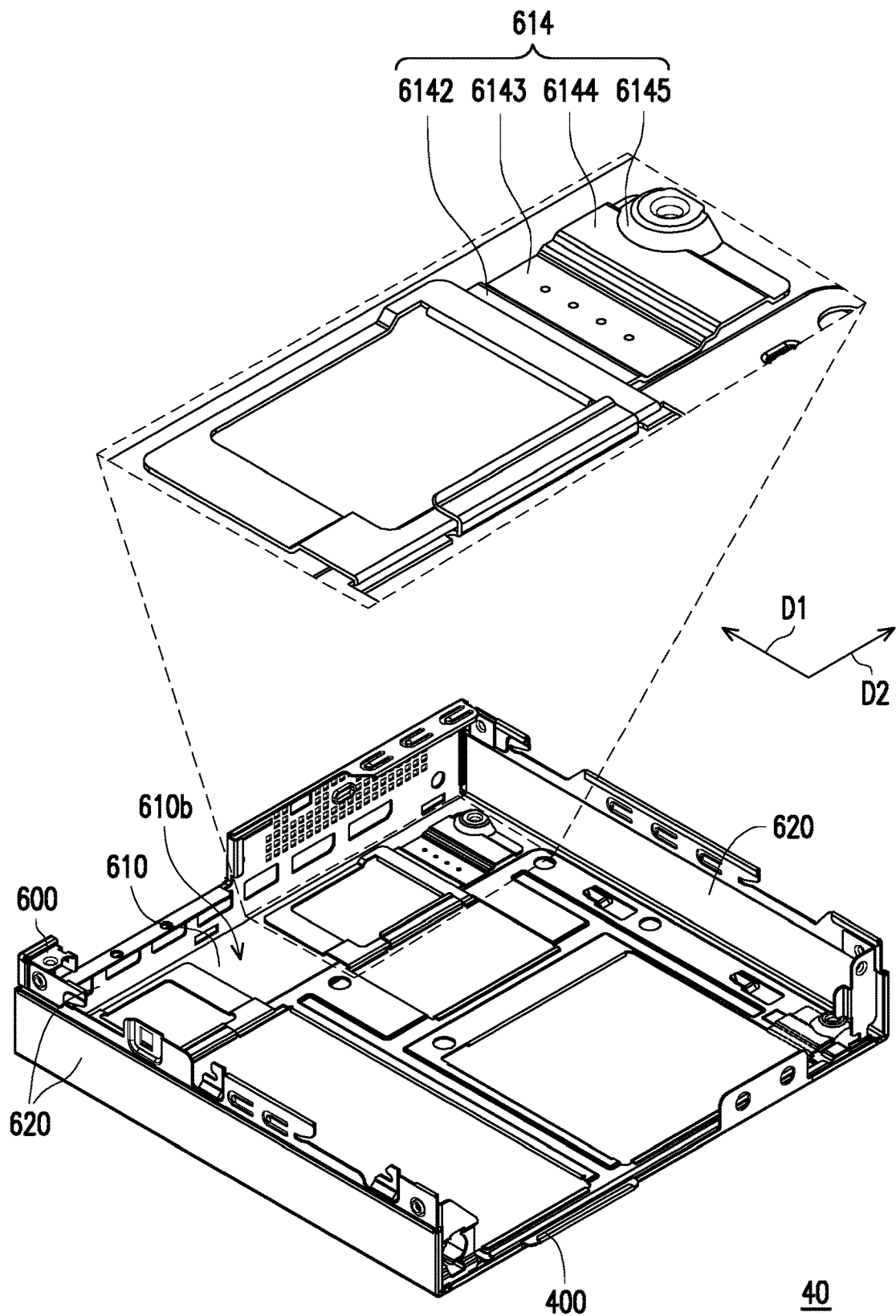
FIG. 4 is a schematic perspective view of a chassis structure according to another embodiment of the disclosure.

FIG. 4 is a schematic perspective view of a chassis structure according to another embodiment of the disclosure. Referring to FIG. 4, in a chassis structure 40 shown in FIG. 4, a main plate 610 and side plates 620 of a box body 600 and a cover 400 have similar configurations and functions as those of the chassis structure 20 shown in FIG. 2B. Accordingly, details thereof are omitted hereinafter. Differences between the chassis structure 40 of the present embodiment and the chassis structure 20 in FIG. 2B lies in that the number of the bonding portion 6143 of the second sub-bent component 614 in the present embodiment is one, and that single bonding portion 6143 is connected between an overlapping portion 6142 and a cradle 6144. For example, a bump 6145 may be formed from the cradle 6144 by means of stamping so as to be completely disposed on the cradle 6144.

FIG. 5 is a schematic perspective view of a chassis structure according to another embodiment of the disclosure. Referring to FIG. 5, in a chassis structure 50 shown in FIG. 5, a main plate 710 and side plates 720 of a box body 700 and a cover 400 have similar configurations and functions as those of the chassis structure 40 shown in FIG. 4. Accordingly, details thereof are omitted hereinafter. A difference between the chassis structure 50 of the present embodiment and the chassis structure 40 in FIG. 4 lies in that a bonding portion 7143 of a second sub-bent component 714 in the present embodiment is connected to two adjacent sides of a cradle 7144.

Specifically, in the present embodiment, a bent body 7122 of a first sub-bent component 712 is configured to be bent toward the second direction D2 from a first folded edge 7121 connected to a hollow region E4, and the length direction of a side of the bent body 7122 (i.e., a first folded edge 7121) is, for example, parallel to the first direction D1. The second sub-bent component 714 is configured to be bent toward the first direction D1 from a second folded edge 7141 connected to an opening 7121a of the first sub-bent component 712, and the first direction D1 is, for example, perpendicular to the length direction of the second folded edge 7141. In addition, an overlapping portion 7142 of the second sub-bent component 714 is located between the bent body 7122 and an inner surface 710b of the main plate 710.

Specifically, the second sub-bent component 714 is bent out from a predetermined position of the first sub-bent component 712 through the second folded edge 7141 toward the direction of an accommodating space S. Then, the opening 7122a is formed in the region where the second sub-bent component 714 is bent out from the first sub-bent component 712, and the bent body 7122 of the first sub-bent component 712 is left on the main plate 710. The second sub-bent component 714 may be further folded in the first direction D1 perpendicular to the length direction of the second folded edge 7141. Subsequently, the first sub-bent component 712 is bent out from a predetermined position at the main plate 710 through the first folded edge 7121 toward the direction of the accommodating space S, and the hollow region E4 is then formed in the region where the first sub-bent component 712 is bent out from bending the main plate 710. Then, the first sub-bent component 712 is further folded toward the inner surface 710b of the main plate 710 in the second direction D2, so that the second sub-bent component 714 is closely attached to the predetermined position on the main plate 710. In the present embodiment, since the second sub-bent component 714 is bent before bending the first sub-bent component 712, the overlapping portion 7142 of the second sub-bent component 714 is located below the bent body 7122 of the first sub-bent component 712.

Furthermore, in the present embodiment, the second sub-bent component 714 has the L-shaped bonding portion 7143 that surrounds the two adjacent sides of the cradle 7144, and the bump 7145 having an assembling hole 7145a may be completely disposed on the cradle 7144. In addition, according to design requirements, a stud or another fixing component (not shown) may be disposed in the opening 7122a of the first sub-bent component 712 for assembling a corresponding electronic component.

FIG. 6 is a schematic perspective view of a chassis structure according to another embodiment of the disclosure. Referring to FIG. 6, in a chassis structure 60 shown in FIG. 6, a main plate 810 and side plates 820 of a box body 800 and a cover 400 have similar configurations and functions as those of the chassis structure 50 shown in FIG. 5. Accordingly, details thereof are not repeated hereinafter. A difference between the chassis structure 60 of the present embodiment and the chassis structure 50 in FIG. 5 lies in that a bent body 8122 of a first sub-bent component 812 in the present embodiment is located between an overlapping portion 8142 of a second sub-bent component 814 and an inner surface of the main plate 810.

Specifically, the bending sequence in the present embodiment is similar to that in the embodiment of FIG. 3. In the present embodiment, the first sub-bent component 812 may be first bent out from the main plate 810 via a first folded edge 8121 connected to the main plate 810, and a hollow region E5 is formed at the main plate 810. After that, the second sub-bent component 814 is then bent out from the first sub-bent component 812 via a second folded edge 8141, and an opening 8122a is formed in the first sub-bent component 812. As a result, the overlapping portion 8142 of the second sub-bent component 814 is located above the bent body 8122 of the first sub-bent component 812. In addition, a bonding portion 8143 may be fixed on the inner surface of the main plate 810 by a bonding material. Therefore, a surface of the bonding portion 8143 may be smooth without a recess therein.

Based on the foregoing, the chassis structure of this disclosure includes a main plate. The main plate and the bent component are integrally formed, and the bent component and the bump disposed thereon are also integrally formed. The assembling hole is disposed on the bump for mounting. Through such design of the main plate, the electronic component may be directly disposed in the chassis structure without the need to add an additional dedicated rack for fastening the electronic component onto the chassis as in the existing design. In addition, the assembling hole of this disclosure is provided on the bump, the bump is disposed on the cradle, and the cradle and the inner surface of the main plate are spatially separated from each other. Consequently, there is no need to provide a riveting hole or other exposed structures on the outer surface of the main plate for fastening the electronic component, thereby maintaining smoothness and neatness of the outer surface of the main plate. In addition, the box body of the chassis structure in this disclosure provides a complete side plate, and it is not necessary to stack the metal components to form the box body and then to form a complete chassis as in the existing design, so the manufacturing costs are thereby saved.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A chassis structure, comprising:
   a box body, comprising:
   a main plate comprising a hollow region and a bent component adjoining to the hollow region, wherein the bent component comprises a folded edge connected to the hollow region, a first sub-bent component and a second sub-bent component connected to the first sub-bent component, wherein the first sub-bent component comprises a bent body and the second sub-bent component comprises an overlapping portion, and the overlapping portion overlaps with the bent body of the first sub-bent component; and a plurality of side plates surrounding a periphery of the main plate and defining an accommodating space;

wherein the first sub-bent component comprises a first folded edge connected to the hollow region, and the second sub-bent component comprises a second folded edge connected to the first sub-bent component; and wherein the bent body has an opening.

2. The chassis structure as recited in claim 1, further comprising: a cover assembled to an outer surface of the main plate and covering the hollow region of the main plate.

3. The chassis structure as recited in claim 2, wherein the main plate further comprises an inner surface opposite to the outer surface, and the bent component is disposed on the inner surface.

4. The chassis structure as recited in claim 1, wherein the main plate and the plurality of side plates are an integral structure.

5. The chassis structure as recited in claim 1, wherein the hollow region and the bent component of the main plate correspond to each other in shape.

6. The chassis structure as recited in claim 1, wherein the bent component further comprises a bonding portion bonded to an inner surface of the main plate.

7. The chassis structure as recited in claim 6, wherein the bent component further comprises a cradle connected to the bonding portion.

8. The chassis structure as recited in claim 7, wherein the cradle and the inner surface of the main plate are spatially separated from each other.

9. The chassis structure as recited in claim 7, wherein the bonding portion is connected to two adjacent sides of the cradle.

10. The chassis structure as recited in claim 7, wherein the bonding portion comprises two sub-bonding portions, and the two sub-bonding portions are disposed on two opposite sides of the cradle.

11. The chassis structure as recited in claim 7, wherein the bent component further comprises a bump, and at least a portion of the bump is disposed on the cradle.

12. The chassis structure as recited in claim 11, wherein the bump is connected to the bonding portion.

13. The chassis structure as recited in claim 11, wherein the bump has an assembling hole.

14. The chassis structure as recited in claim 1, wherein the first sub-bent component and the second sub-bent component of the main plate are an integral structure.

15. The chassis structure as recited in claim 1, wherein the overlapping portion is connected to the second folded edge of the second sub-bent component.

16. The chassis structure as recited in claim 1, wherein the overlapping portion is located between an inner surface of the main plate and the bent body of the first sub-bent component.

17. The chassis structure as recited in claim 1, wherein the bent body of the first sub-bent component is located between an inner surface of the main plate and the overlapping portion of the second sub-bent component.

* * * * *